United States Patent [19]

Eakin

[11] Patent Number: 5,380,677
[45] Date of Patent: Jan. 10, 1995

[54] METHOD FOR REDUCING RESISTANCE AT INTERFACE OF SINGLE CRYSTAL SILICON AND DEPOSITED SILICON

[75] Inventor: John C. Eakin, Foster City, Calif.

[73] Assignee: VLSI Technology, Inc., San Jose, Calif.

[21] Appl. No.: 82,119

[22] Filed: Jun. 23, 1993

[51] Int. Cl.⁶ .......................................... H01L 21/203
[52] U.S. Cl. ...................... 437/106; 437/946; 437/228; 156/643; 134/1
[58] Field of Search .................. 437/106, 946, 228; 148/DIG. 17; 156/10, 643; 134/1

[56] References Cited

U.S. PATENT DOCUMENTS

| | | | |
|---|---|---|---|
| 4,687,543 | 8/1987 | Bowker | 156/643 |
| 4,963,506 | 10/1990 | Liaw et al. | 437/946 |
| 4,985,372 | 1/1991 | Narita | 437/946 |
| 5,010,026 | 4/1991 | Gomi | 437/31 |
| 5,120,394 | 6/1992 | Mukai | 156/610 |
| 5,122,482 | 6/1992 | Hayashi et al. | 148/DIG. 17 |
| 5,238,849 | 8/1993 | Sato | 148/DIG. 17 |

Primary Examiner—R. Bruce Breneman
Assistant Examiner—Ramamohan R. Paladugu
Attorney, Agent, or Firm—Flehr, Hohbach, Test, Albritton & Herbert

[57] ABSTRACT

An interface having low resistance is formed between a single crystal silicon surface and deposited silicon. Before deposition of the silicon, the oxide or nitride layer covering the surface is removed in conventional fashion. The exposed surface is then pre-treated with a plasma etch containing $SF_6$. Because fluorine is more electro-negative than oxygen, fluorine atoms adhere to the exposed single crystal silicon surface, where their presence prevents reoxidation. Silicon is then deposited on the surface by thermal decomposition of silane, during which deposition the fluorine atoms form silicon-tetrafluoride, which gas is evacuated during a normal out-gas cycle. The resultant interface, which may be an emitter-base junction, exhibits an effective resistance of only a few ohms.

16 Claims, 3 Drawing Sheets

METHOD FOR REDUCING RESISTANCE AT INTERFACE OF SINGLE CRYSTAL SILICON AND DEPOSITED SILICON

FIELD OF THE INVENTION

This invention relates generally to the fabrication of semiconductor devices, and more particularly to the fabrication of devices including an interface between single crystal silicon and deposited silicon, such as the formation of a transistor emitter region using doped polysilicon.

BACKGROUND OF THE INVENTION

Historically, the emitter region of a bipolar transistor was formed by implanting or diffusing dopant into a single crystal base region previously formed on an underlying substrate. However, in the last several years implants and diffusions have been replaced with a method whereby doped polysilicon is used as a dopant source to form an underlying emitter region.

According to this method, a doped polysilicon structure is formed above the base region. The dopant is then driven-in with heat such that the dopant diffuses downward, penetrating into the underlying base. This diffusion of dopant from the polysilicon into the single crystal substrate forms a very shallow and a very abrupt emitter-base junction. Further, this method of forming an emitter region using a doped polysilicon dopant source is advantageously compatible with existing metal-oxide-silicon ("MOS") and bipolar metal-oxide-silicon ("BiCMOS") fabrication processes.

This prior art formation of an emitter region is depicted in FIGS. 1A-1D. FIG. 1A depicts a preliminary stage in the formation of a bipolar transistor on a single crystal substrate or wafer 2. Initially, a collector region 4 and buried layer region 6 are formed, after which the base region 8 is formed of an opposite polarity dopant.

Overlying the single crystal collector and base regions will be a relatively thick (50 Å to 1,000 Å) layer 10 of oxide, or perhaps nitride. Often layer 10 will be silicon dioxide, $SiO_2$, a compound that always forms automatically with silicon that is exposed to oxygen and/or moisture. Alternatively, layer 10 may be a nitride layer, e.g., $Si_3N_4$, that was deposited to protect the underlying regions shown in FIG. 1A during processing of other devices on the same substrate. For example, where substrate 2 includes MOS devices, a nitride layer 10 is usually formed to protect the underlying bipolar transistor region while etching away the MOS device gate oxide.

Before a doped polysilicon structure can be formed atop the base region 8, the oxide or nitride layer 10 must be removed. If layer 10 were allowed to remain, it would interfere with the formation of the emitter-base interface. More specifically, the continued presence of an oxide or nitride layer 10 would contribute an unacceptably large equivalent resistance in series with the emitter junction. This resistance is shown symbolically in FIG. 1D as R.

According to the prior art and as depicted in FIG. 1B, the oxide or nitride layer 10 is removed by wetting the entire structure with hydrofluoric acid, and then rinsing the structure. Although the acid wet dip will remove layer 10, unfortunately the moment the wafer is dry and exposed to air a new native oxide layer 12 forms, as depicted in FIG. 1B. Typically the new layer oxide 12 will only be about 3 Å to 4 Å thick, approximately the diameter of a molecule. Oxide layer 12 inevitably forms because silicon is a self-passivating material that reacts with oxygen to form $SiO_2$.

As shown in FIG. 1C, a region of doped polysilicon 14 is next deposited over the base region 8, but unfortunately is separated therefrom by the few angstrom thick layer 12. The doped polysilicon structure 14 is then driven in with heat, whereupon the dopant (which is the same polarity type as that of the collector region 4) diffuses downward to form the emitter region 16. FIG. 1C depicts the fabrication process after this driving-in step has occurred.

However, because the dopant from the doped polysilicon structure 14 was separated from the base region 8 by the oxide layer 12, an equivalent base-emitter series resistance R of perhaps 200Ω to 300Ω results, as shown in FIG. 1D. In most applications, an emitter-base series resistance of a few hundred ohms severely degrades the performance of transistor 2.

According to the prior art, the above-described series resistance is present whenever a single crystal silicon structure interfaces with a region of deposited silicon, or amorphous silicon. Because the interface will always be separated by a few angstrom of native oxide, there will always be a resultant series resistance across the interface of several hundred ohms.

What is needed is a method for fabricating such interfaces without the formation of an inherent, relatively large series interface resistance. More particularly, what is needed in fabricating a bipolar transistor is a method of forming the emitter using a doped polysilicon dopant source, without the presence of a native oxide layer 12. Such method should be compatible with existing bipolar and BiCMOS fabrication sequences, and should result in a series resistance of a few ohms or so. The present invention describes such a method.

SUMMARY OF THE INVENTION

As noted, during the preliminary formation of a bipolar transistor, there will exist a typically 50 Å to 1,000 Å thick oxide or nitride layer at the surface of the base region and exposed silicon. The present invention removes this layer by etching the silicon surface with a fluorine based plasma.

Because fluorine is more electro-negative than oxygen, the fluorine atoms are absorbed chemically onto the surface of the single crystal silicon. The presence of these fluorine atoms prevents oxygen atoms from linking with the silicon surface to form silicon dioxide.

Thereafter, deposition of an overlying polysilicon (or amorphous) structure occurs, as in the prior art. The polysilicon results from the thermal decomposition of silane, whose silicon atoms react with the fluorine atoms present on the surface of the single crystal silicon, according to the present invention. The reaction between the fluorine atoms and the silane-produced silicon atoms forms silicon-tetrafluoride, a gas that is then evacuated from the deposition furnace in a normal gas evacuation step. Because no substantial oxide layer exists between the upper surface of the single crystal base region and the lower surface of the doped polysilicon, the emitter-base junction is formed with an equivalent emitter resistance of only about two ohms.

The present invention may be practiced to reduce resistance across the interface of single crystal silicon and a deposit of silicon, including polysilicon, and amorphous silicon.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 1A:
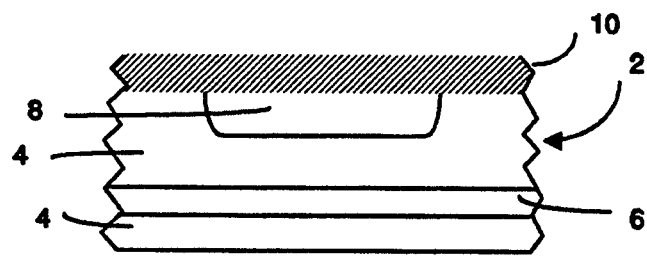
FIG. 1A depicts a preliminary step in the formation of a bipolar transistor, according to the prior art.
Figure 2A:
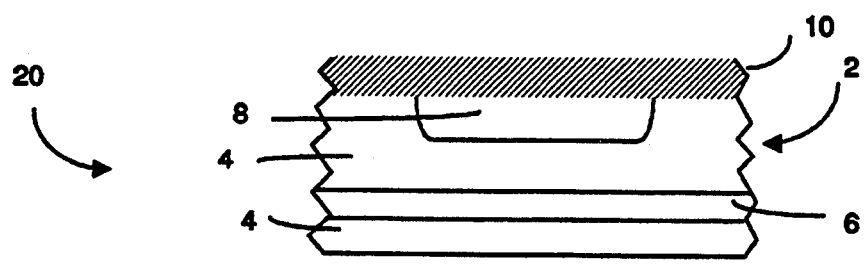
FIG. 2A depicts the starting point for the present invention, namely a single crystal silicon surface covered by a layer of oxide or nitride, according to the prior art.

FIG. 2A depicts the starting point for the formation of interfaces between single crystal silicon and deposited silicon or amorphous silicon, according to the present invention. FIG. 2A, which is identical to FIG. 1A, depicts a single crystal substrate or wafer 2, whereon a semiconductor device 20 is being formed. As has been described with reference to FIG. 1A, the upper surface 30 of device 20 is covered with a layer 10 of oxide or nitride. Although device 20 is depicted as a bipolar transistor, other structures benefiting from decreased single crystal structure-to-silicon interface resistance may also be produced. For example, memory devices requiring low resistance buried polysilicon-to-substrate contacts (also called "butting" contacts) may be fabricated according to the present invention.

Figure 3:
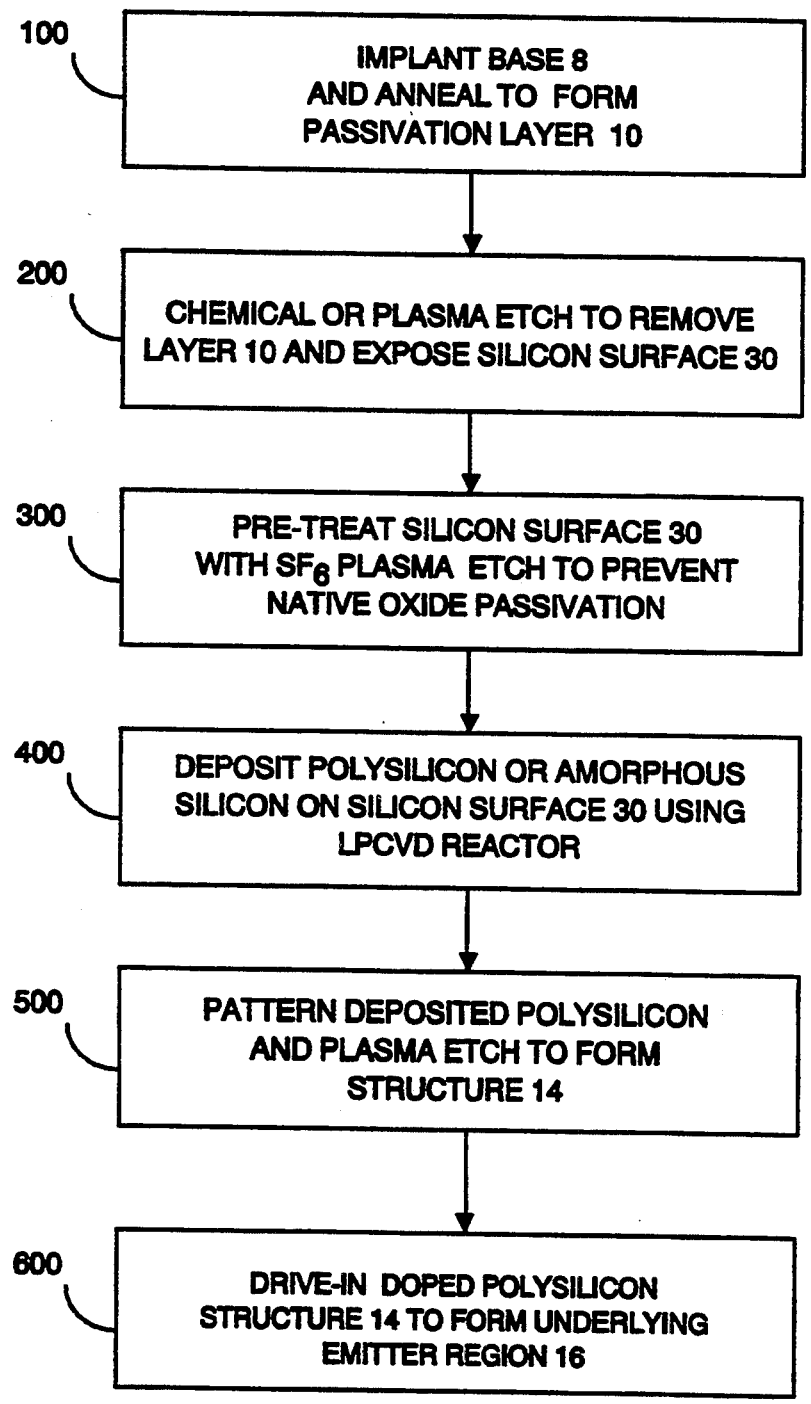
FIG. 3 is a flow chart depicting process steps in the formation of an interface between a single crystal silicon structure and polysilicon or amorphous silicon, according to the present invention, which steps occur after formation of the structure shown in FIG. 2A and result in formation of the structure shown in FIG. 2C.

FIG. 3, step 100 depicts the semiconductor process corresponding to FIG. 2A, and does not represent a departure from the prior art.

FIG. 3, step 200 is also known in the prior art, and represents the removal of layer 10 to expose the underlying single crystal silicon surface 30. Step 200 preferably is accomplished using chemical or plasma etching.

Figure 1B:
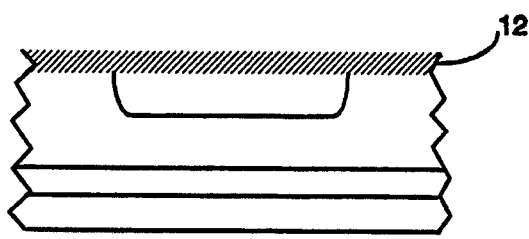
FIG. 1B depicts a stage in the formation of a transistor wherein a native oxide layer is always present, according to the prior art.

However whereas prior art FIG. 1B shows the inevitable formation of a native oxide layer 12, the formation of such oxide layer is precluded in the present invention in the following manner. By way of overview, at step 300 (FIG. 3), fluorine atoms are caused to bind to the exposed surface 30, which atoms prevent oxidations. Later (during step 400), these fluorine atoms outgas during deposition of the polysilicon or amorphous silicon to the non-oxidized single crystal silicon surface 30.

FIG. 3, step 300 represents the point of departure from the prior art. The semiconductor device 20 remains in a vacuum environment between process steps 200 and 300, and thus no oxide layer can form on surface 30 before step 300 is begun. At step 300, the exposed silicon surface 30 is pre-treated with $SF_6$ plasma that is preferably formed using a gas mixture of sulphur hexafluoride and helium.

Although silicon is normally self-passivating and wants to react with oxygen to form $SiO_2$, the fluorine atoms in the plasma are more electro-negative than oxygen, and will bind more strongly to silicon valence electrons than will oxygen. As such, the fluorine atoms bind exceedingly strongly to the single crystal silicon surface 30. Applicant believes that what occurs is that fluorine atoms from the $SF_6$ plasma are absorbed chemically onto the single crystal silicon surface 30. The presence of these fluorine atoms (shown as "atomic dots" F in FIG. 2B) prevents oxygen atoms from linking with the silicon surface 30 to form silicon dioxide.

It will be appreciated that applicant's plasma utilizes an element, fluorine, that is sufficiently electro-negative relative to oxygen to protect the exposed single silicon crystal surface against oxidation. Possibly plasmas other than $SF_6$ could also produce the desired result. However $SF_6$ results in a very clean process in that no polymers are formed during etching. This is in contrast to other fluorine-containing gases commonly used for plasma etching, e.g., $CF_4$, $CHF_3$, $C_2F_6$. In the presence of carbon, the fluorine in these other plasmas can form poly-carbon films that would be detrimental to the interface.

According to the present invention, the $SF_6$ pre-treatment process step 300 is carried out using a parallel plate etcher, operated at a power of about 100 to 300 watts, a pressure in the approximate range 300 to 500 mT, an $SF_6$ flow in the approximate range 100 to 200 sccm, for a time duration of about 7 to 12 seconds.

Figure 2B:
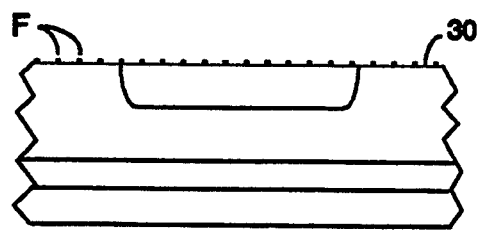
FIG. 2B depicts the surface of a single crystal silicon structure after the oxide or nitride layer of FIG. 2A has been etched with a fluorine based plasma, according to the present invention.

FIG. 2B depicts the semiconductor device 20 after completion of process step 300. In contrast to what was depicted in prior art FIG. 1B, there is no native oxide layer atop surface 30.

At process step 400, FIG. 3, a deposition of polysilicon or amorphous silicon is now made, preferably within a low pressure chemical vapor deposition ("LPCVD") reactor, as is known in the art. Polysilicon results from the thermal decomposition of silane, $SiH_4 \rightarrow Si + 2H_2$. If decomposition occurs at a sufficiently low temperature, amorphous silicon can be produced, and if decomposition occurs at a sufficiently high temperature, polysilicon is produced.

According to the present invention, during polysilicon (or amorphous silicon) deposition, silicon atoms from the silane decomposition react with the fluorine atoms F present on the single crystal silicon surface 30. The reaction forms the gas silicon-tetrafluoride, $SiF_4$, which is evacuated from the deposition furnace during a normal gas evacuation cycle.

Because there is no intervening oxide layer, the deposited polysilicon or amorphous silicon can form an intimate, low resistive, contact with the single crystal silicon surface 30.

Figure 1C:
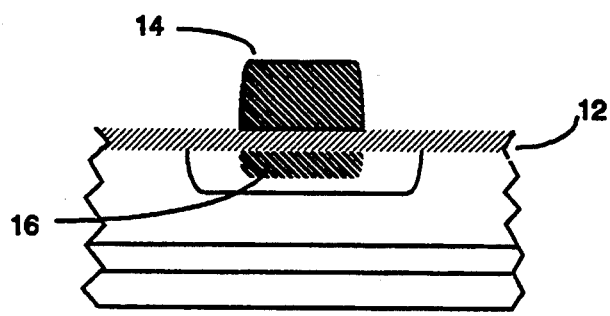
FIG. 1C depicts a further stage in the formation of a transistor, wherein the upper surface of the single crystal region is separated from an overlying polysilicon or amorphous region by a native oxide layer, according to the prior art.
Figure 1D:
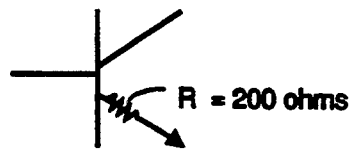
FIG. 1D depicts symbolically the presence of a relatively large series resistance across the interface of single crystal silicon and a deposition of polysilicon or amorphous silicon, according to the prior art.
Figure 2C:
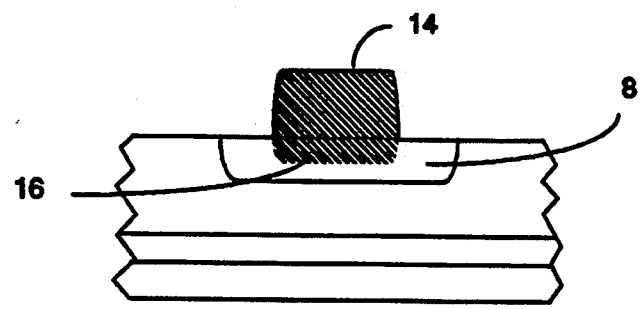
FIG. 2C depicts the intimate interface of a single crystal silicon structure and an overlying deposition of polysilicon or amorphous silicon, according to the present invention.

At FIG. 3, process step 500 the polysilicon is doped using ion implantation or a diffusion furnace, patterned using conventional photolithography, and preferably plasma etched to form structure 14, shown in FIG. 2C. At process step 600, the doped polysilicon is thermally driven-in, which step forms an emitter 16 in the substrate region underlying structure 14. As such, process steps 500 and 600 are similar to prior art steps used to create the structure depicted in FIG. 1C.

Figure 2D:
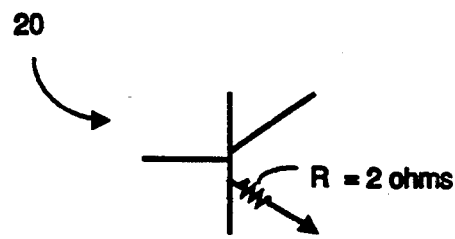
FIG. 2D depicts symbolically the relatively low series resistance across the interface of single crystal silicon and a deposition of polysilicon or amorphous silicon, according to the present invention.

However, in stark contrast to prior art FIG. 1C, FIG. 2C shows a device 20 whose polysilicon or amorphous structure 14 interfaces with an underlying single crystal silicon emitter region 16, without an intervening native oxide layer. The absence of an oxide layer 12 results in a substantial reduction in the interface resistance R, producing a resistance of a few ohms as contrasted with a few hundred ohms, as shown symbolically in FIG. 2D.

Modifications and variations may be made to the disclosed embodiments without departing from the subject and spirit of the invention as defined by the following claims.

What is claimed is:

1. A method of forming a low resistance interface between a single crystal silicon surface and silicon deposited on said surface, the method comprising the following steps:
   (a) removing from said surface any pre-existing oxide layer;
   (b) exposing said surface to a plasma containing an element that is gaseous at room temperature and is more electro-negative than oxygen to preclude substantial oxidation on said surface; and
   (c) depositing silicon on said surface.

2. The method of claim 1, wherein at step (b) said plasma contains $SF_6$, and wherein said element is fluorine.

3. The method of claim 2, wherein said $SF_6$ is formed from a gas mixture containing sulphur hexafluoride and helium.

4. The method of claim 1, wherein said step (c) results in the removal of said element from said surface.

5. The method of claim 1, wherein said step (c) is accomplished by thermal decomposition of silane.

6. The method of claim 1, wherein:
   at step (b) said plasma contains $SF_6$, and said element is fluorine, and;
   at step (c) said silicon is deposited by thermal decomposition of silane, during which deposition fluorine atoms on said surface are removed therefrom by forming silicon-tetrafluoride gas.

7. The method of claim 2, wherein step (b) is carried out in a parallel plate etcher operated with at least one characteristic selected from the group consisting of (i) a power in the range 100 watts to 300 watts, (ii) a pressure in the approximate range 300 mT to 500 mT, (iii) an $SF_6$ flow in the approximate range 100 sccm to 200 sccm, and (iv) a time duration of about 7 seconds to 12 seconds.

8. The method of claim 1, wherein at step (c), said silicon deposited on said surface is selected from the group consisting of (i) polysilicon, and (ii) amorphous silicon.

9. The method of claim 1, wherein said interface is formed between an emitter region and a base region in a bipolar transistor.

10. The method of claim 1, wherein step (a) is carried out using a process selected from the group consisting of (i) a chemical etch, and (ii) a plasma etch.

11. A method of forming a low resistance emitter-base junction in a bipolar transistor structure formed in single crystal silicon whose collector and base regions are already formed, said structure having an uppermost surface covered with an oxide layer, the method comprising the following steps:
   (a) removing from said surface said oxide layer;
   (b) exposing said surface to a plasma containing an element that is gaseous at room temperature and is more electro-negative than oxygen to preclude substantial oxidation on said surface;
   (c) depositing silicon on said surface by thermally decomposing silane gas;
   (d) doping said silicon deposited in step (c); and
   (e) driving-in dopant in said silicon deposited in step (c) to form an emitter region;
   wherein an interface between said emitter region and said base region exhibits a substantially low interface resistance.

12. The method of claim 11, wherein at step (b) said plasma is formed from a gas mixture containing sulphur hexafluoride and helium.

13. The method of claim 11, wherein at step (b) said plasma contains $SF_6$, said element is fluorine, and during step (c) fluorine atoms at said surface resulting from step (b) are removed from said surface by forming silicon-tetrafluoride gas.

14. The method of claim 11, wherein step (b) is carried out in a parallel plate etcher operated with at least one characteristic selected from the group consisting of (i) a power in the range 100 watts to 300 watts, (ii) a pressure in the approximate range 300 mT to 500 mT, (iii) an $SF_6$ flow in the approximate range 100 sccm to 200 sccm, and (iv) a time duration of about 7 seconds to 12 seconds.

15. The method of claim 11, wherein at step (c), said silicon deposited on said surface is selected from the group consisting of (i) polysilicon, and (ii) amorphous silicon.

16. The method of claim 11, wherein at step (b), said plasma contains $SF_6$, and said element is fluorine.

* * * * *